United States Patent
Connell et al.

(10) Patent No.: US 7,332,979 B2
(45) Date of Patent: Feb. 19, 2008

(54) LOW NOISE REFERENCE OSCILLATOR WITH FAST START-UP

(75) Inventors: Lawrence E. Connell, Naperville, IL (US); Daniel P. McCarthy, Elk Grove Village, IL (US); Michael L. Bushman, Hanover Park, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 11/261,978

(22) Filed: Oct. 28, 2005

(65) Prior Publication Data
US 2007/0096841 A1    May 3, 2007

(51) Int. Cl.
*H03B 5/36* (2006.01)
(52) U.S. Cl. .................... 331/183; 331/160
(58) Field of Classification Search ............ 331/183, 331/160, 158
See application file for complete search history.

(56) References Cited

U.S. PATENT DOCUMENTS 6,052,036 A    4/2000   Enström et al.
6,483,391 B1   11/2002  Magoon et al.
2006/0071729 A1 * 4/2006  Cetin et al. ........... 331/158

* cited by examiner

*Primary Examiner*—Joseph Chang
(74) *Attorney, Agent, or Firm*—Brinks Hofer Gilson & Lione

(57) ABSTRACT

A frequency source having a fast start-up time and low noise in steady state is presented. The frequency source includes an oscillator and a hybrid automatic gain control (AGC) loop that switches between an analog AGC loop at oscillator start up and a digital AGC loop at steady state operation. The analog AGC loop includes a peak detector connected to the oscillator and an error integrator integrating the difference between the peak detector output and a reference voltage. The digital AGC loop includes a comparator comparing the peak detector output and high/low reference voltages, an oscillator counter providing a timer signal, a digital-to-analog converter (DAC) supplied with a digital word, and a low pass filter between the DAC and the oscillator. The timer signal causes a multiplexer to select either the analog AGC loop or the digital AGC loop.

20 Claims, 5 Drawing Sheets

100

Figure 4 - Reference Oscillator Start-up Time

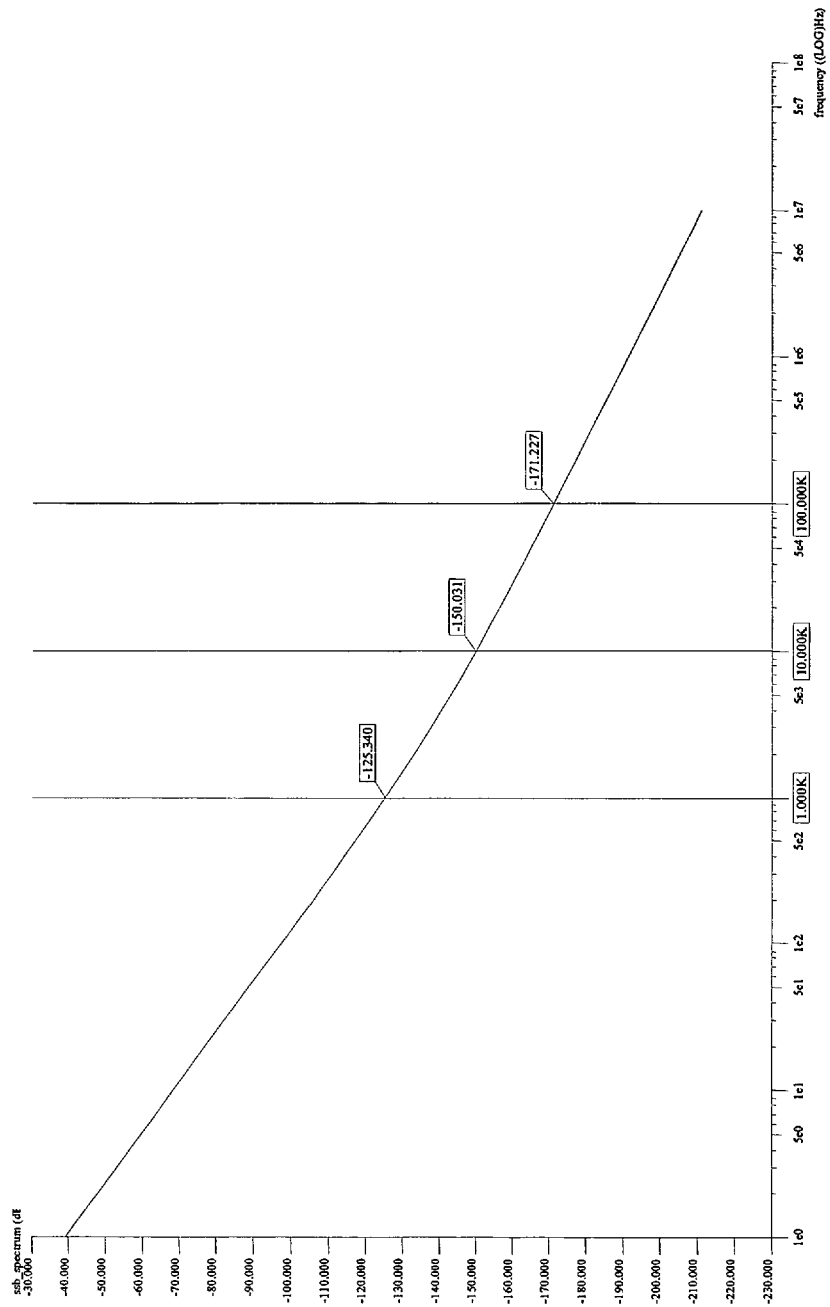
Figure 5 - Single Side Band Phase Noise vs Frequency

LOW NOISE REFERENCE OSCILLATOR WITH FAST START-UP

TECHNICAL FIELD

The present embodiments relate to an oscillator. More specifically, the present embodiments relate to an oscillator having a decreased start-up time and low noise in steady state operation.

BACKGROUND

Many modern electronic circuits, such as those used in communications, use a high tolerance, low noise reference frequency source. These reference frequency sources typically contain quartz crystal oscillator circuits. Active devices having gain are used to excite the crystal oscillator, which takes a finite amount of time to reach steady state operation from start-up. Optimum low noise performance from a crystal oscillator is dependent on the gain of the active devices. This gain contributes to the noise of the oscillator. The gain to achieve the desired oscillation amplitude is dependent on the crystal resistance of the crystal oscillator.

However, the crystal resistance is not constant, typically being higher at start-up than when oscillating in steady state. The crystal resistance is related to the Q factor of the oscillator, which determines the amount of power applied to the crystal to keep it oscillating at the same amplitude. As the resistance decreases, the amount of power consumed decreases. The variation in the crystal resistance causes more power to be used at start-up than is desired to achieve the best noise performance in steady state operation. However, decreasing the power such that optimal noise performance is achieved in steady state increases the amount of time for the crystal oscillator to reach steady state from start-up. Conversely, it is desirable in many applications for the crystal oscillator to reach a stable steady state frequency in a minimum amount of time. Accordingly, it is desirable to provide a reference oscillator that has both a fast start-up time and low noise at steady state operation.

In addition, physical variations in the crystals themselves cause the amplitude of the crystal oscillations to vary. Thus, the crystals in a batch of crystals may have different steady state oscillation frequencies over a particular amplitude range. Similarly, variations in the ambient temperature of the oscillator circuit may cause the steady state oscillation amplitude of a particular crystal to fluctuate due to changes in the gain of the circuit. It is thus additionally desirable to provide an arrangement that provides compensation for both crystal-to-crystal variation and temperature variation for a single crystal.

BRIEF DESCRIPTION OF THE DRAWINGS

The present invention is illustrated by way of example and not limited to the accompanying figures in which like references indicate similar elements.

FIG. 4 show graphs of the oscillator, reference, and start signals with respect to time for one embodiment of the AGC loop.

FIG. 5 is a graph showing the phase noise vs. oscillator output for the AGC loop shown in FIG. 1 when in digital mode.

Skilled artisans appreciate that elements in the figures are illustrated for simplicity and clarity and have not necessarily been drawn to scale.

DETAILED DESCRIPTION

A hybrid automatic gain control (AGC) loop for a frequency source is presented. The hybrid AGC loop contains both an analog AGC loop and a digital AGC loop. The AGC monitors the amplitude of a crystal oscillator of the frequency source. The analog AGC loop controls excitation of the crystal oscillator at start-up time, and the digital AGC loop controls excitation of the crystal oscillator after steady state operation has been achieved. The AGC feedback loop adjusts the gain of the oscillator to keep the amplitude substantially constant. This permits the AGC loop, which introduces noise that can modulate the oscillator, to initially have a faster starting analog mode and then switch into a digital mode. In the digital mode, the oscillator output changes occur relatively slowly compared with the analog mode as the digital controller is updated at a slower rate. However, the digital mode produces lower noise than the analog mode. The hybrid AGC loop can be used in any product in which a low noise oscillator is desired, such as a tuner integrated circuit for communication equipment.

Figure 1:
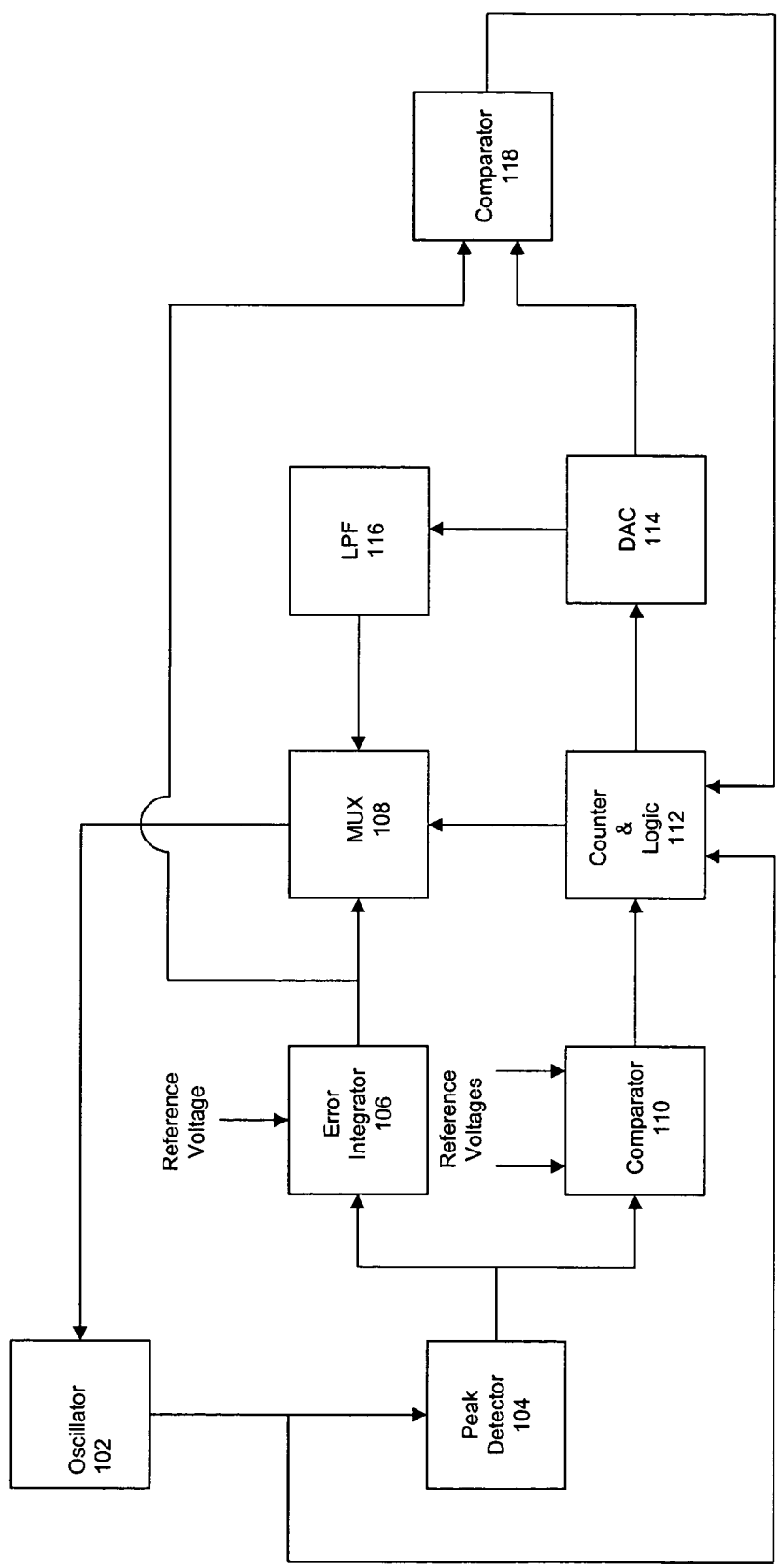
FIG. 1 illustrates an AGC loop according to one embodiment.

FIG. 1 shows one embodiment of a hybrid AGC. The hybrid AGC 100 includes an amplitude-controllable oscillator 102, a peak detector 104, an error integrator 106, a multiplexer (MUX) 108, a first comparator 110, a counter (timer) and digital control logic block 112, a digital-to-analog converter (DAC) 114, a low pass filter 116, and a second comparator 118. Although descriptions are provided below, one of skill in the art will be familiar with the various individual elements such as the comparator, MUX, analog integrator, low pass filter and peak detector.

In one embodiment, the oscillator 102 is a crystal oscillator, which contains a quartz crystal. The crystal is excited by a power supply to produce sine wave oscillations of an amplitude that depends on the excitation power.

An output of the oscillator 102 is connected to an input of the peak detector 104. The peak detector 104 is an analog circuit that detects the peak amplitude of the oscillator 102. An output of the peak detector 104 is supplied to an input of the error integrator 106 and an input of the first comparator 110.

Figure 2:
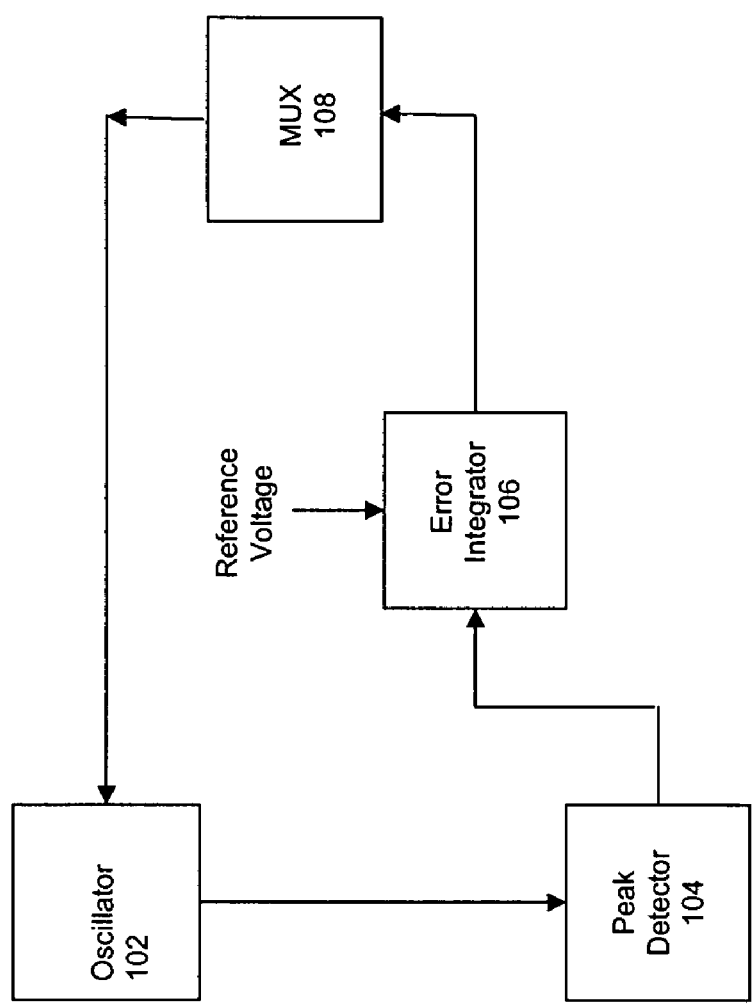
FIG. 2 illustrates the AGC loop of FIG. 1 when in analog mode.

A view of the AGC loop 100 when in analog mode is shown in FIG. 2. FIG. 2 illustrates that during start-up, the feedback path to control the amplitude of the oscillator 102 includes the peak detector 104, the error integrator 106, and the MUX 108.

The error integrator 106 is also supplied with a reference voltage. The reference voltage may be provided by, in one embodiment, a voltage divider connected between the power supply and ground. The power supply in turn may be a regulated supply voltage (e.g. a battery). The voltage divider may contain fixed or adjustable resistors. Accordingly, the reference voltage supplied to the error integrator 106 can be set to any desired value.

The error integrator 106 compares the peak value detected by the peak detector 104 with the reference voltage and integrates a difference between the output of the peak detector 104 and the reference voltage. The error integrator 106 can be implemented by an analog circuit. In one embodiment, the error integrator 106 includes an operational amplifier (op-amp) having an inverting input to which the signal from the peak detector 104 is supplied through a resistor, a non-inverting input to which the reference voltage is supplied, and a capacitor connected between an output of the op-amp and the inverting input.

An output of the error integrator 106 is supplied to one input of the MUX 108. The selector of the MUX 108 is connected to the counter and logic circuitry 112, which supplies a selection signal to the MUX 108. The MUX 108 selects the output of the error integrator 106 when the hybrid AGC 100 is in analog mode, such as during start-up. An output of the MUX 108 is supplied to the oscillator 102 to drive the crystal in the oscillator.

Figure 3:
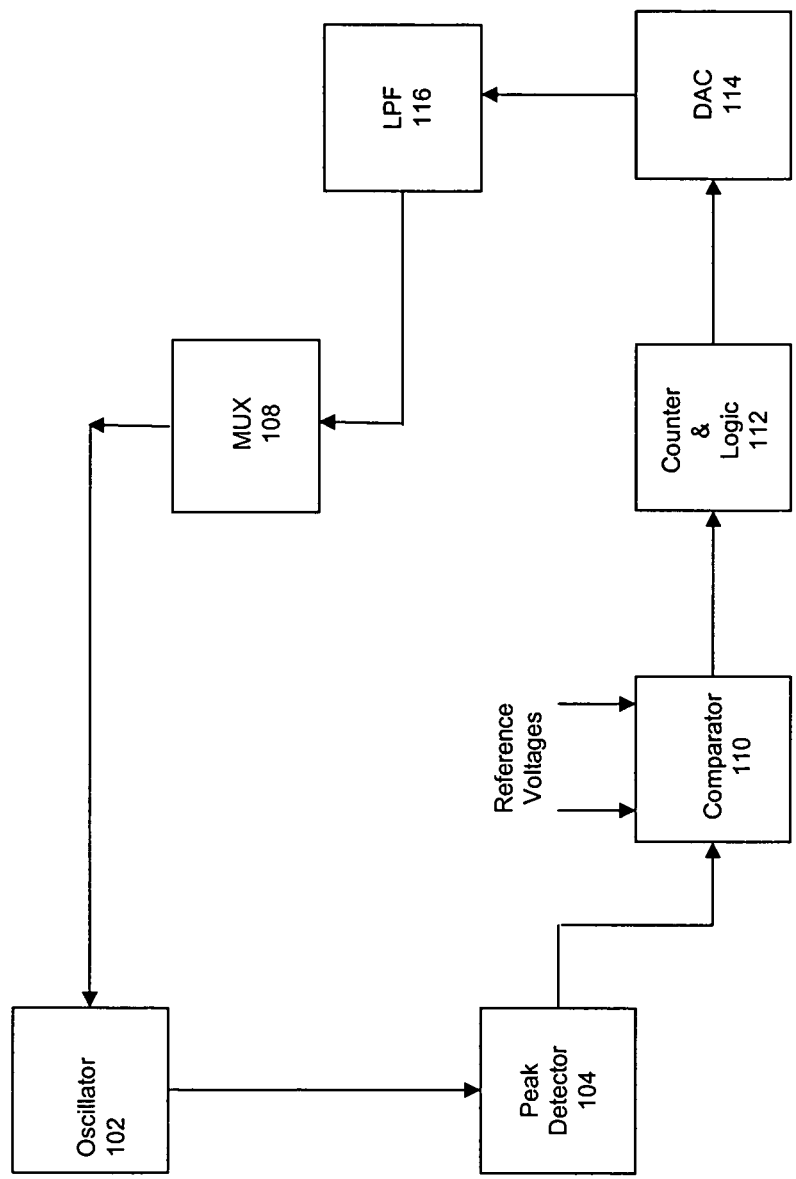
FIG. 3 illustrates the AGC loop of FIG. 1 when in digital mode.

On the other hand, FIG. 3 shows a view of the AGC loop 100 when in digital mode. FIG. 3 illustrates that during steady state operation the feedback path to control the amplitude of the oscillator 102 includes the peak detector 104, the first comparator 110, the counter and digital logic block 112, the digital-to-analog converter (DAC) 114, the low pass filter 116, and the MUX 108.

An output of the peak detector 104 is supplied to an input of the first comparator 110. The first comparator 110 is also supplied with at least two reference voltages. These reference voltages are different and may be supplied by a voltage divider or other circuitry in a manner similar to that of the reference voltage supplied to the error integrator 106. The reference voltages supplied to the first comparator 110 represent the range of acceptable amplitude voltages supplied by the oscillator 102 before the power to the oscillator 102 is to be adjusted.

More specifically, an output of the first comparator 110 is supplied to the DAC 114 through counter and logic circuitry block 112. The reference voltages supplied to the first comparator 110 are the low and high voltages of the amplitude of the oscillator 102 before the output of the DAC 114 is adjusted. For example, if the oscillator 102 has a nominal 1V peak to peak, the low and high reference voltages may be 0.95V and 1.05V, respectively.

Counter and logic circuitry block 112 contains a first counter (up/down counter) and a second counter (ripple counter). First comparator 110 and the up/down counter of counter and logic block 112 comprise a digital error integrator. The output of first comparator 110 is a tri-state signal indicating whether the up/down counter should count up, count down or retain its current value. When the output of peak detector 104 is outside the reference voltage window of first comparator 110, the output of first comparator 110 will allow the up/down counter to count either up or down; when the output of peak detector 104 is within the reference voltage window, the up/down counter will hold its value. The output of the up/down counter is a digital word (e.g. a binary number). In some embodiments, this word is the digital equivalent of the analog output of error integrator 106 in the analog loop. The digital word is supplied to DAC 114 where it is converted to an analog voltage comparable to the output of analog error integrator 106. The second binary counter (ripple counter) acts as a timer and is used to determine when the output of MUX 108 is to be switched from the analog to the digital output. This ripple counter also performs the operation of determining when to update the up/down counter output to DAC 114. The up/down counter output is updated at predetermined intervals. Controlling the update rate and low pass filtering the output of DAC 114 using LPF 116 reduces noise associated with digital loop operation.

The output of the DAC 114 is supplied to the oscillator 102 through the LPF 116. The LPF 116 decreases the higher frequency noise generated by the DAC 114 during switching of the DAC 114 when the DAC 114 steps up or down to adjust the gain of the oscillator 102. The LPF 116 may be implemented by any number of circuits. The LPF 116 passes frequencies ranging from DC to a set value. In one embodiment, the corner frequency of a single-pole RC filter is about 100 kHz.

The AGC loop 100 operates as shown by the example of FIG. 4. Before start-up, the signal from the oscillator 102, shown in the top graph as Xtal1, and the regulated voltage to the oscillator 102, shown as the middle graph, are low. At start-up, the power down signal shown in the bottom graph of FIG. 4 transitions to low (e.g. about 0.9 ms). The peak detector 104 detects a low voltage provided from the oscillator 102 and the error integrator 106 provides a maximum voltage, which the MUX 108 passes to the oscillator 102. The voltage supplied to the oscillator 102 thus quickly increases to a maximum, taking about 0.1 ms as shown in one example.

Eventually, the oscillator 102 begins to oscillate, as shown at around 1.5 ms. Once the amplitude of the oscillating signal from the oscillator 102 reaches a predetermined amount, the signals are used as clock signals for the digital circuitry in the AGC loop 100. This starts the ripple counter in the counter and digital logic block 112. The ripple counter, in turn, triggers the up/down counter to update the DAC 114.

The DAC 114 provides an output that is compared to the output from the error integrator 106 by the second comparator 118. The result from the second comparator 118 is fed back to the digital logic in counter and logic block 112, whose result is supplied to the DAC 114. The DAC 114 input counts up or down and adjusts its output so that it eventually approaches or essentially equals that of the error integrator 106. The output of the DAC 114 thus settles and reaches that of the error integrator 106, so that when the AGC loop 100 switches from the analog AGC loop to the digital AGC loop, the oscillator 102 does not experience a large change in the driving signal.

After a specified number of cycles of oscillation, the oscillator 102 has reached steady state. The ripple counter determines when the predetermined number of cycles have occurred, and then disconnects the output of the error integrator 106 from the oscillator 104 and connects the low pass filtered DAC 114 output using the MUX 108. This occurs in FIG. 4 between 1.7 ms and 1.8 ms. The first comparator 110 then compares the output of the peak detector 104 to the high and low reference voltages. If the output of the peak detector 114 drifts outside the reference voltage window, the first comparator 110 enables the up/down counter in counter and logic block 112 to count in the appropriate direction. The output of the up/down counter is converted to an analog control voltage by the DAC 114, and the analog voltage is low pass filtered by the LPF 116 to minimize noise. The filtered control voltage is then fed back to the oscillator 102 to control its amplitude.

As described, the AGC loop 100 is switched from an analog loop to a digital loop (i.e. steady state operation is deemed to have occurred) after a predetermined amount of time. In one embodiment, the ripple counter in counter and logic block 112 is connected to the output from the oscillator 102 and is used as a timer. In this case, one output of the ripple counter is used to trigger the switch from analog to digital while another downstream output is used to trigger logic in counter and logic block 112 to check the amplitude of oscillation in steady state. Alternatively, a second oscillator that is already in steady state may be used to determine the time.

This time may be set empirically, after measuring the response using a large number of oscillators and taking the worst case scenario. In this case, the empirical result may be stored in the logic or elsewhere for comparison purposes. The time also depends on the frequency of the crystal. For example, it may take 1 ms for a crystal that operates at 20 MHz, as shown in FIG. 4, or 5 ms for a crystal that operates at 4 MHz. Correspondingly, for a crystal that operates at 20 MHz, the ripple counter may cause the logic block 112 to check the oscillation amplitude every 10 ms in steady state.

Alternatively, rather than using a predetermined amount of time from when power is initially supplied to the oscillator 102, the oscillation amplitude of the oscillator 102 may be monitored and used to switch between the analog and digital loops. As the oscillator 102 is starting up and before it reaches steady state (e.g. before switching to the digital loop) some overshoot and ringing may occur. The overshoot and ringing depends on the loop stability. The loop thus may be switched when the amplitude of oscillator 102 has stabilized and falls within a specific window for a specified period of time.

Although the power supply is regulated, an unregulated power supply may be used or the regulated power supply may drift. The above embodiments also permit compensation for the amplitude of the power supply.

FIG. 5 is a graph of the phase noise vs. oscillator output for the AGC loop shown in FIG. 1 when in digital mode. The graph shows the performance of digital loop, which is substantially better than the noise performance of the corresponding analog loop. As can be seen, at 1 kHz, 10 kHz, and 100 kHz offsets from the carrier frequency, the noise is −125 dB, −150 dB, and −171 dB, respectively, below the carrier amplitude.

Thus, by combining the elements of both an analog AGC loop and a digital control loop, a low noise reference oscillator with a minimized start-up time is provided. The start-up time is minimized by first initializing the amplitude of the oscillator with an analog AGC loop. After the amplitude of the oscillator has stabilized for a predetermined amount of time, the AGC loop is switched from analog control during the start up mode to digital control in the steady state mode to provide a lower noise control. Accordingly, a frequency source that has both a fast start-up time and low noise at steady state operation is provided. This frequency source additionally is able to compensate for both crystal-to-crystal variation and temperature variation for a single crystal. The structure or embodiments may also be used to provide a slower start time or higher noise in steady state operation.

Although a hybrid AGC has been described in which the analog AGC loop is used at start-up and the digital AGC loop is used in steady state operation, if desired, the hybrid AGC loop 100 can switch between the analog and digital AGC loops as desired. Thus, for example, the analog AGC loop may be used in the steady state mode. Further, any criteria desired may be used to switch between the analog and digital AGC loops.

Note that the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A frequency source comprising:
   an amplitude-controllable oscillator; and
   a hybrid automatic gain control (AGC) loop connected with the oscillator, the hybrid AGC loop comprising an analog AGC loop and a digital AGC loop, the analog AGC loop operable to be connected to the oscillator when the oscillator starts up and the digital AGC loop operable to be connected to the oscillator after the oscillator has reached steady state operation.

2. The frequency source of claim 1, wherein an output of a peak detector is connected to the analog AGC loop and to the digital AGC loop; and an input of the peak detector is connected to the analog AGC loop and to the digital AGC loop.

3. The frequency source of claim 1, wherein the oscillator comprises a crystal.

4. The frequency source of claim 1, wherein the hybrid AGC loop comprises a multiplexer and logic, the logic operable to supply a selection signal to the multiplexer such that the multiplexer selects either the analog AGC loop or the digital AGC loop.

5. The frequency source of claim 1, wherein the analog AGC loop comprises a peak detector and an error integrator connected with an output of the peak detector and a reference voltage, the error integrator operable to integrate a difference between the output of the peak detector and the reference voltage.

6. The frequency source of claim 1, wherein the digital AGC loop comprises:
   a peak detector operable to detect a peak amplitude of the oscillator,
   a comparator connected with an output of the peak detector and a pair of different reference voltages that form a voltage window,
   a ripple counter connected with an output of the oscillator and operable to provide a timer signal, and an up/down counter connected with an output of the comparator and operable to provide a digital word,
   a digital-to-analog converter (DAC) connected with the ripple counter and the up/down counter and operable to receive the digital word and to be updated by the timer signal, an output of the updated DAC adjusted dependent on the digital word, and
   a low pass filter (LPF) connected with an output of the DAC, the oscillator driven dependent on an output of the LPF.

7. The frequency source of claim 1, further comprising a comparator operable to compare outputs of the analog and digital AGC loops when the oscillator is in start up mode and to supply a feedback signal to the digital AGC loop to adjust the output of the digital AGC loop such that the outputs of the analog and digital AGC loops are approximately the same when the hybrid AGC loop switches driving the oscillator from the analog AGC loop to the digital AGC loop.

8. A frequency source comprising:
   an amplitude-controllable oscillator; and
   a hybrid automatic am control AGC loop connected with the oscillator, the hybrid AGC boy comprising an analog AGC loop and a digital AGC loop, wherein the hybrid AGC loop is operable to drive the oscillator from the analog AGC loop to the digital AGC loop after a predetermined amount of time.

9. The frequency source of claim 8, wherein the predetermined amount of time is determined from a set number of oscillations of the oscillator after the oscillations have reached a predetermined threshold.

10. A control circuit comprising:
an analog automatic gain control (AGC) loop;
a digital AGC loop;
a multiplexer operable to select between outputs of the analog and digital AGC loops; and
a first comparator connected with the outputs of the analog and digital AGC loops, the first comparator operable to provide a feedback signal to the digital AGC loop such that the outputs of the analog and digital AGC loops are about the same.

11. The control circuit of claim 10, wherein the analog AGC loop comprises:
a peak detector operable to detect a peak amplitude of a signal to be measured; and
an error integrator connected with an output of the peak detector and a reference voltage, the error integrator operable to integrate a difference between the output of the peak detector and the reference voltage.

12. The control circuit of claim 10, wherein the digital AGC loop comprises:
a peak detector operable to detect a peak amplitude of a signal to be measured,
a second comparator connected with an output of the peak detector and a pair of different reference voltages that form a voltage window,
a ripple counter operable to receive the signal to be measured and to provide a timer signal, an output of at least one of the first or second comparator connected with an up/down counter operable to provide a digital word,
a digital-to-analog converter (DAC) connected with the ripple counter and the up/down counter, the DAC operable to receive the digital word and be updated by the timer signal, an output of the updated DAC adjusted dependent on the digital word, and
a low pass filter (LPF) connected with an output of the DAC, the output of the digital loop dependent on an output of the LPF.

13. The control circuit of claim 10, wherein the multiplexer is operable to switch an output of the multiplexer from the analog AGC loop to the digital AGC loop after a predetermined amount of time from a starting event.

14. The control circuit of claim 10, wherein an output of the multiplexer is sufficient to drive a crystal oscillator.

15. A method for controlling a crystal oscillator, the method comprising switching between providing an output of an analog automatic gain control (AGC) loop to the oscillator when the oscillator starts up and providing an output of a digital AGC loop to the oscillator after the oscillator has reached steady state operation.

16. The method of claim 15, further comprising supplying a selection signal to a multiplexer such that the multiplexer selects either the analog AGC loop or the digital AGC loop.

17. The method of claim 15, wherein the analog AGC loop comprises a peak detector that detects a peak amplitude of the oscillator and an error integrator supplied with an output of the peak detector and a reference voltage, the error integrator integrating a difference between the output of the peak detector and the reference voltage, the oscillator being driven dependent on a result of the integration.

18. The method of claim 15, wherein the digital AGC loop comprises:
a peak detector that detects a peak amplitude of the oscillator,
a comparator supplied with an output of the peak detector and a pair of different reference voltages that form a voltage window,
a ripple counter to which an output of the oscillator is supplied to provide a timer signal, and an up/down counter to which an output of the comparator is supplied to provide a digital word,
a digital-to-analog converter (DAC) supplied with the digital word and updated by the timer signal, an output of the updated DAC being adjusted dependent on the digital word, and
a low pass filter (LPF) to which an output of the DAC is supplied, the oscillator being driven dependent on an output of the LPF.

19. The method of claim 15, further comprising comparing outputs of the analog and digital AGC loops when the oscillator is in start up mode and supplying a feedback signal to the digital AGC loop to adjust the output of the digital AGC loop such that the outputs of the analog and digital AGC loops are approximately the same when driving of the oscillator is switched from the analog AGC loop to the digital AGC loop.

20. The method of claim 15, wherein driving of the oscillator is switched from the analog AGC loop to the digital AGC loop after a predetermined amount of time.

* * * * *